United States Patent
Lee et al.

(10) Patent No.: US 8,226,450 B2
(45) Date of Patent: Jul. 24, 2012

(54) METHOD OF MANUFACTURING DISPLAY DEVICE, DISPLAY DEVICE THEREFROM AND MANUFACTURING APPARATUS THEREFOR

(75) Inventors: Dong-won Lee, Seongnam-si (KR); Jung-soo Rhee, Seoul (KR); Jin-koo Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 53 days.

(21) Appl. No.: 12/794,411

(22) Filed: Jun. 4, 2010

(65) Prior Publication Data

US 2010/0240160 A1  Sep. 23, 2010

Related U.S. Application Data

(62) Division of application No. 11/557,512, filed on Nov. 8, 2006, now abandoned.

(30) Foreign Application Priority Data

Dec. 7, 2005  (KR) .......................... 10-2005-0118601

(51) Int. Cl.
*H05B 33/10* (2006.01)

(52) U.S. Cl. .......................................... 445/53; 313/504
(58) Field of Classification Search .......... 313/498–512; 315/169.3; 345/36, 45, 76; 445/53
See application file for complete search history.

(56) References Cited

U.S. PATENT DOCUMENTS

| 6,503,831 B2* | 1/2003 | Speakman ..................... 438/674 |
| 2003/0063154 A1* | 4/2003 | Goto ............................... 347/40 |
| 2003/0132987 A1* | 7/2003 | Ogawa ............................. 347/58 |
| 2005/0110852 A1* | 5/2005 | Lee et al. ......................... 347/97 |
| 2005/0242745 A1 | 11/2005 | Jung |

* cited by examiner

*Primary Examiner* — Nimeshkumar Patel
*Assistant Examiner* — Christopher Raabe
(74) *Attorney, Agent, or Firm* — Cantor Colburn LLP

(57) ABSTRACT

A method of manufacturing a display device includes forming a thin film transistor on an insulating substrate, forming an electrode which is electrically connected with the thin film transistor, forming a wall which surrounds the electrode, supplying a first solvent to the electrode that is surrounded by the wall, and supplying ink which comprises an organic material and a second solvent to the electrode which has previously received the first solvent. Thus, the manufacturing method produces a display device which has a uniform organic layer.

9 Claims, 17 Drawing Sheets

32(32b)  33   32a  31

FIRST
DIRECTION

FIRST DIRECTION

METHOD OF MANUFACTURING DISPLAY DEVICE, DISPLAY DEVICE THEREFROM AND MANUFACTURING APPARATUS THEREFOR

CROSS REFERENCE TO RELATED APPLICATIONS

This application is a divisional application of U.S. application Ser. No. 11/557,512, filed on Nov. 8, 2006, claims priority to Korean Patent Application No. 2005-0118601, filed on Dec. 7, 2005, and all the benefits accruing therefrom under 35 U.S.C. §119, the contents of which in its entirety are herein incorporated by reference.

BACKGROUND OF THE INVENTION

1. Field of the Invention

The present invention relates to a method of manufacturing a display device, a display device produced therefrom and a manufacturing apparatus therefor. More particularly, the present invention relates to a method of manufacturing a display device which makes vaporization conditions of ink uniform to form a uniform organic layer, a display device produced therefrom and a manufacturing apparatus therefor.

2. Description of the Related Art

Recently, organic light emitting diode ("OLED") displays have increased in popularity since they are driven through a low voltage; are lightweight and small; have a wide viewing angle; and respond with high speed to signal inputs. OLED displays are classified into passive matrix type and active matrix type according to their driving method. The passive matrix type has a simple production process, but power consumption drastically increases with an increase in size and resolution. Thus, the passive matrix type is mainly employed in devices requiring a small display. Meanwhile, the active matrix type is capable of realizing a wide screen and high resolution, but has a relatively complex production process.

In the active matrix type OLED display, each pixel region is connected to an individual thin film transistor ("TFT") which controls emission of an organic light emitting layer to emit light in that pixel region. A pixel electrode is provided in each of the pixel regions, and the pixel electrodes are electrically separated from each other so that each pixel may be driven independently. A hole injecting layer and the organic light emitting layer are formed on the pixel electrodes.

Typically, an organic layer is formed through an inkjet method, in which ink comprising an organic material is dropped on the pixel electrode. The pixel electrode is surrounded by a wall which contains the ink. The ink is then dried leaving the organic layer.

However, the thickness of the organic layer is not uniform since the drying conditions differ between the center and the circumference of dropped ink.

BRIEF SUMMARY OF THE INVENTION

Accordingly, it is an aspect of the present invention to provide a method of manufacturing a display device which has a uniform organic layer.

Also, it is another aspect of the present invention to provide a display device which has a uniform organic layer.

Further, it is another aspect of the present invention to provide a manufacturing apparatus which manufactures a display device having an uniform organic layer.

Additional aspects and/or advantages of the present invention will be set forth in part in the description which follows and, in part, will be obvious from the description, or may be learned by practice of the present invention.

The foregoing and/or other aspects of the present invention can be achieved by providing an exemplary embodiment of a method of manufacturing a display device, including forming a thin film transistor on an insulating substrate, forming an electrode which is electrically connected with the thin film transistor, forming a wall which surrounds the electrode; supplying a first solvent to the electrode which is surrounded by the wall, and supplying ink which includes an organic material and a second solvent to the electrode which has received the first solvent.

According to another exemplary embodiment of the present invention, the first solvent is supplied to at least one of a plurality of electrodes around the circumference of the electrode which receives the ink.

According to another exemplary embodiment of the present invention, the first solvent and the second solvent include substantially the same material.

According to another exemplary embodiment of the present invention, the first solvent has a lower boiling point than the second solvent.

According to another exemplary embodiment of the present invention, the second solvent includes a first sub-solvent which has a first boiling point and a second sub-solvent which has a second boiling point higher than the first boiling point, and the first solvent and the first sub-solvent include substantially the same material.

According to another exemplary embodiment of the present invention, the ink is supplied along a plurality of sub-jetting regions which are provided in parallel with each other in a first direction and elongated in a second direction which is substantially perpendicular to the first direction.

According to another aspect of the present invention, the first solvent is supplied along a sub-jetting region which is adjacent to the sub-jetting region wherein the ink is supplied.

According to another exemplary embodiment of the present invention, the ink is sequentially supplied in the first direction with respect to the plurality of sub-jetting regions, and the sub-jetting region along which the first solvent is supplied is ahead of the sub-jetting region along which the ink is supplied, along the first direction.

According to another exemplary embodiment of the present invention, the first solvent and the ink are supplied along the same sub-jetting region.

According to another exemplary embodiment of the present invention, the plurality of sub-jetting regions include a pair of external sub-jetting regions disposed opposite each other along the first direction, and an internal sub-jetting region which is disposed within the pair of external sub-jetting regions, and a greater amount of the first solvent is supplied to the pair of external sub-jetting regions than to the internal sub-jetting regions.

According to another exemplary embodiment of the present invention, the plurality of sub-jetting regions include a pair of external sub-jetting regions disposed opposite each other along the first direction, and an internal sub-jetting region which is disposed within the pair of external sub-jetting regions, further including supplying the first solvent to the pair of external sub-jetting regions.

The foregoing and/or other aspects of the present invention can be achieved by providing an exemplary embodiment of a display device, including a thin film transistor which is formed on an insulating substrate, an electrode which is electrically connected with the thin film transistor, a wall which surrounds the electrode; and an organic layer which is surrounded by the wall and formed by supplying a first solvent and then ink having an organic material and a second solvent, to the electrode.

According to another exemplary embodiment of the present invention, the first solvent is supplied to at least one of a plurality of electrodes around the circumference of the electrode which receives the ink.

According to another exemplary embodiment of the present invention, the first solvent and the second solvent include substantially the same material.

According to another exemplary embodiment of the present invention, the first solvent has a lower boiling point than the second solvent.

According to another exemplary embodiment of the present invention, the second solvent includes a first sub-solvent having a first boiling point and a second sub-solvent having a second boiling point which is higher than the first boiling point, and the first solvent and the first sub-solvent include substantially the same material.

The foregoing and/or other aspects of the present invention can be achieved by providing an exemplary embodiment of a device for manufacturing a display device, including a stage which includes a seating region which stably seats a substrate having a plurality of electrodes, a nozzle head which includes a first sub-nozzle head and a second sub-nozzle head, a supplier which supplies a first solvent to the first sub-nozzle head and ink having an organic material and a second solvent to the second sub-nozzle head, a driver which moves the nozzle head and the stage relative to one another, and a controller which controls the supplier and the driver to supply the ink to one of the plurality of electrodes which has received the first solvent.

According to another exemplary embodiment of the present invention, the manufacturing device further includes a head main body to which the nozzle head is mounted.

According to another exemplary embodiment of the present invention, the driver moves the nozzle head and the stage relative to one another in a first direction and a second direction which is perpendicular to the first direction.

According to another exemplary embodiment of the present invention, the first sub-nozzle head and the second sub-nozzle head are provided along the first direction or the second direction.

According to another exemplary embodiment of the present invention, the driver includes a first sub-driver which moves the nozzle head in the first direction, and a second sub-driver which moves the stage in the second direction.

BRIEF DESCRIPTION OF THE DRAWINGS

The above and/or other aspects and advantages of the present invention will become apparent and more readily appreciated from the following description of the exemplary embodiments, taken in conjunction with the accompanying drawings of which.

DETAILED DESCRIPTION OF THE INVENTION

Figure 1:
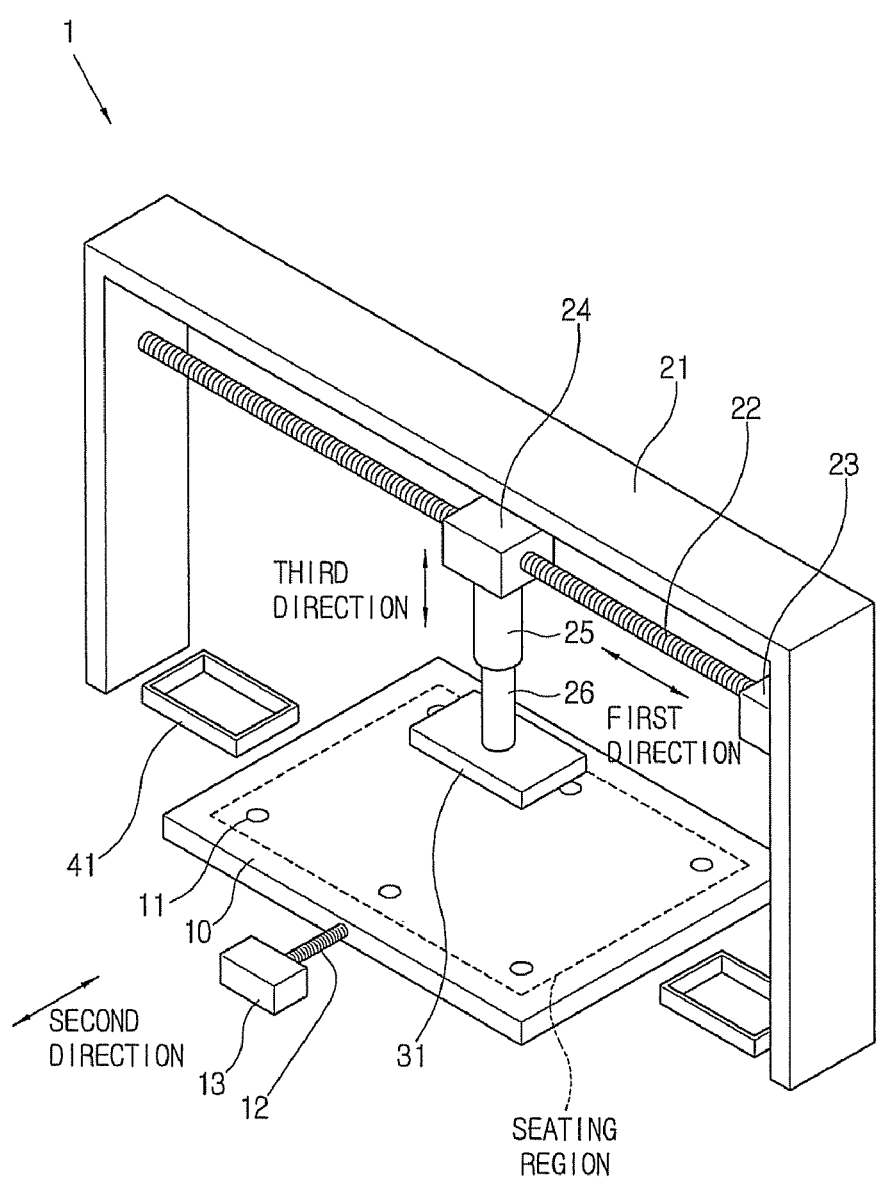
FIG. 1 is a perspective view of an exemplary embodiment of an inkjet device which is used to manufacture a display device according to the present invention.

Hereinafter, embodiments of the present invention will be described with reference to accompanying drawings, wherein like numerals refer to like elements and repetitive descriptions will be avoided as necessary.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
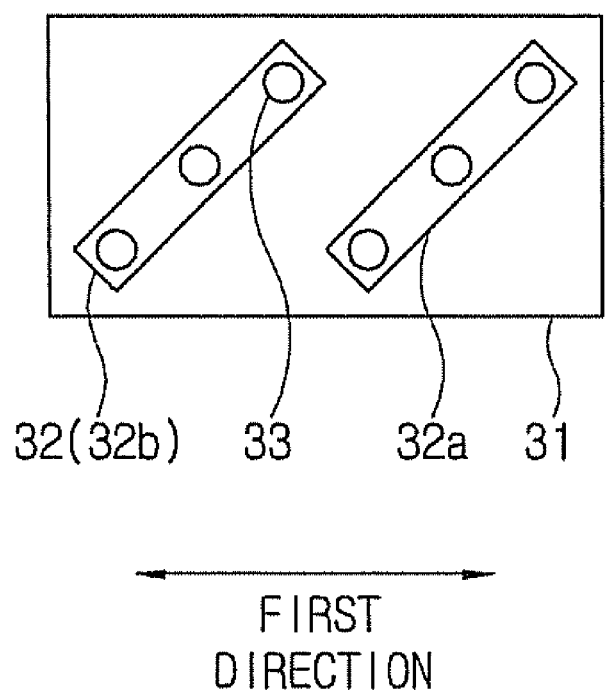
FIG. 2A illustrates a plan view as seen from below of an exemplary embodiment of the nozzle head of the inkjet device used in manufacturing the display device according to the present invention.
Figure 2B:
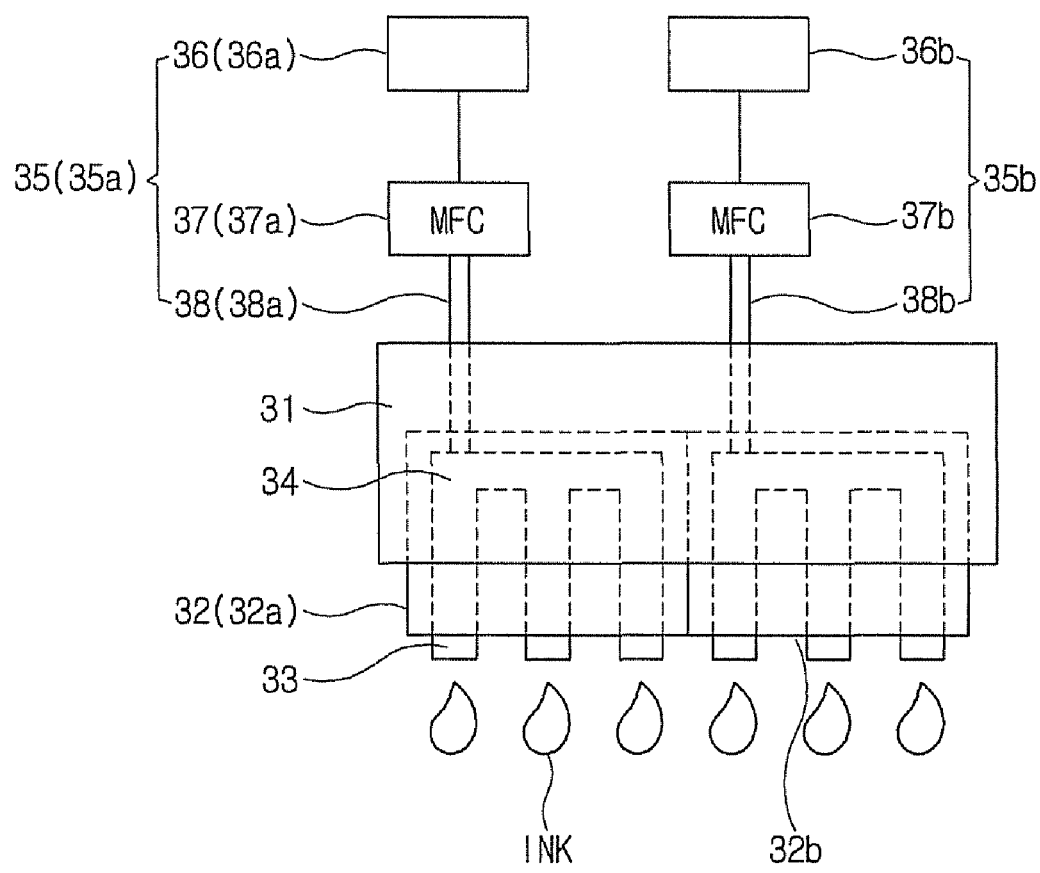
FIG. 2B is a schematic illustration of an exemplary embodiment of a nozzle head assembly illustrating a cross-sectional view of the head main body from FIG. 1.

Referring to FIGS. 1, 2A and 2B, an exemplary embodiment of an inkjet device which is used to manufacture a display device according to the present invention will be described. FIG. 1 is a perspective view of the inkjet device which is used to manufacture a display device according to the present invention. FIGS. 2A and 2B illustrate a nozzle head of the inkjet device used in manufacturing the display device according to the present invention.

An inkjet device 1 comprises a stage 10 on which a substrate may be seated; a plurality of nozzle heads 32 which are provided on a head main body 31 and further comprise a plurality of nozzles 33 to jet ink; and a pair of spittoons 41 which are provided on either end of the stage 10 along a first direction.

The head main body 31 and the stage 10 may move relative to one another in a first direction and a second direction which are perpendicular to each other. The inkjet device 1 comprises a first driver 23 which is connected with the head main body through a first rotating screw 22 which allows movement in the first direction. The inkjet device also comprises a second driver 13 which is connected with the stage 10 through a second rotating screw 12 which allows movement in the second direction.

The stage 10 has a substantially rectangular shape and comprises a seating region on which a substrate may be seated. During the display manufacturing process an organic layer is formed on the substrate by jetting ink onto the substrate. The stage 10 may comprise a vacuum chuck 11 to attach the seated substrate to the stage 10, but the present invention is not limited thereto. Alternative embodiments include configurations where the substrate may be attached to the stage 10 through other means such as a static chuck.

The stage 10 is connected with the second driver 13 through a second rotating screw 12. The second rotating screw rotates clockwise or counterclockwise through the second driver 13. In this exemplary embodiment the stage 10 reciprocates in the second direction in parallel with a shorter side thereof, as the second rotating screw 12 rotates. Alternative embodiments include configurations wherein the orientation of the stage 10 is rotated so that it reciprocates in the second direction in parallel with a longer side thereof. The second driver 13 may comprise a motor.

Alternative exemplary embodiments include configurations where the inkjet device 1 further comprises a rail (not shown) to move the stage 10 without difficulty.

A supporting main body 21 is provided above the stage 10. The supporting main body 21 has a [-shape and supports a head main body 31. The plurality of nozzle heads 32 are mounted on the head main body 31. The supporting main body 21 extends in a perpendicular direction to the second direction.

The first rotating screw 22 is provided in the supporting main body 21. A first end of the first rotating screw 22 is rotatably connected with a first side of the supporting main body 21, and a second end thereof is connected with the first driver 23 connected with a second side of the supporting main body 21. The first rotating screw 22 is coupled with a rotating shaft connector 24 having a female screw. The rotating shaft connector 24 reciprocates along the first direction according to a rotation of the first rotating screw 22.

The head main body 31 connected with the rotating shaft connector 24 reciprocates according to the movement of the rotating shaft connector 24. As the first rotating screw 22 extends in a perpendicular direction to the second direction, the moving direction of the head main body 31 is perpendicular to the moving direction of the stage 10.

The head main body 31 is connected with the rotating shaft connector 24 through a third driver 25 and an intermediate connector 26. The third driver 25 may withdraw and extend so that the head main body 31 may reciprocate in a third direction which is perpendicular to a plate surface of the stage 10. Thus, the head main body 31 may be raised or lowered relative to the stage 10.

With the foregoing configuration, the stage 10 and the head main body 31 may move with respect to each other, but the present invention is not limited to this configuration. Alternative embodiments include other configurations capable of moving the stage 10 and the head main body 31, relative to one another.

Referring to FIGS. 2A and 2B, the nozzle heads 32 will be described in more detail. FIG. 2A illustrates a plan view of the head main body 31 having the nozzle heads 32 and nozzles 33, as seen from the stage 10 below.

In this exemplary embodiment the head main body 31 is shaped like a rectangle and has a longer side parallel to the first direction. The nozzle heads 32 comprise sub-nozzle heads 32a and 32b which are mounted in the head main body 31 along the first direction. Each of the nozzle heads 32 extends to a predetermined angle with the first direction. The angle is determined by the desired spacing of the deposits on the object to be ink-jetted. Three nozzles 33 are mounted in a row in each of the nozzle heads 32. The nozzle heads 32 receive ink from an ink supplier 35. The ink supplier 35 comprises an ink tank 36 which stores ink therein, a mass flow controller 37 which controls the mass flow of ink; and a pipe 38 which connects the ink tank 36 and the head main body 31. The ink supplier 35 comprises two sub-ink suppliers 35a and 35b. The sub-ink suppliers 35a and 35b supply ink to each of the sub-nozzle heads 32a and 32b, respectively. The ink tank 36, the mass flow controller 37 and the pipe 38 comprise sub-ink tanks 36a and 36b, sub-mass flow controllers 37a and 37b and sub-pipes 38a and 38b, respectively.

The sub-ink suppliers 35a and 35b may supply different or substantially similar ink, respectively.

Ink is supplied to the head main body 31 through the pipe 38, then it is supplied to the nozzles 33 through a flow path 34 provided in the head main body 31, and finally the ink is supplied to nozzle heads 32 to be jetted.

Turning back to FIG. 1, the spittoons 41 are provided at each of the lateral sides of the stage 10. The spittoons 41 have a bowl shape to accommodate jetted ink. Alternative embodiments include configurations where the spittoons 41 may comprise a cloth to absorb jetted ink. When ink is not jetted from the nozzles 33, the nozzles 33 may become clogged or suffer a drop in performance due to a buildup of particulate in the nozzle 33 or flowpath 34. Thus, the head main body 31 is positioned above the spittoons 41 to jet ink thereon during jetting standby time, e.g., when replacing a substrate. In this manner, ink continuously flows without a particle build-up therefore malfunctions of the nozzles 33 or flowpath 34 are reduced, or effectively prevented.

The spittoons 41 are provided at either end of supporting main body 21 underneath the first rotating screw 22. Thus, the head main body 31 may move in the first direction along the first rotating screw 22 to be positioned above the spittoons 41.

Figure 3:
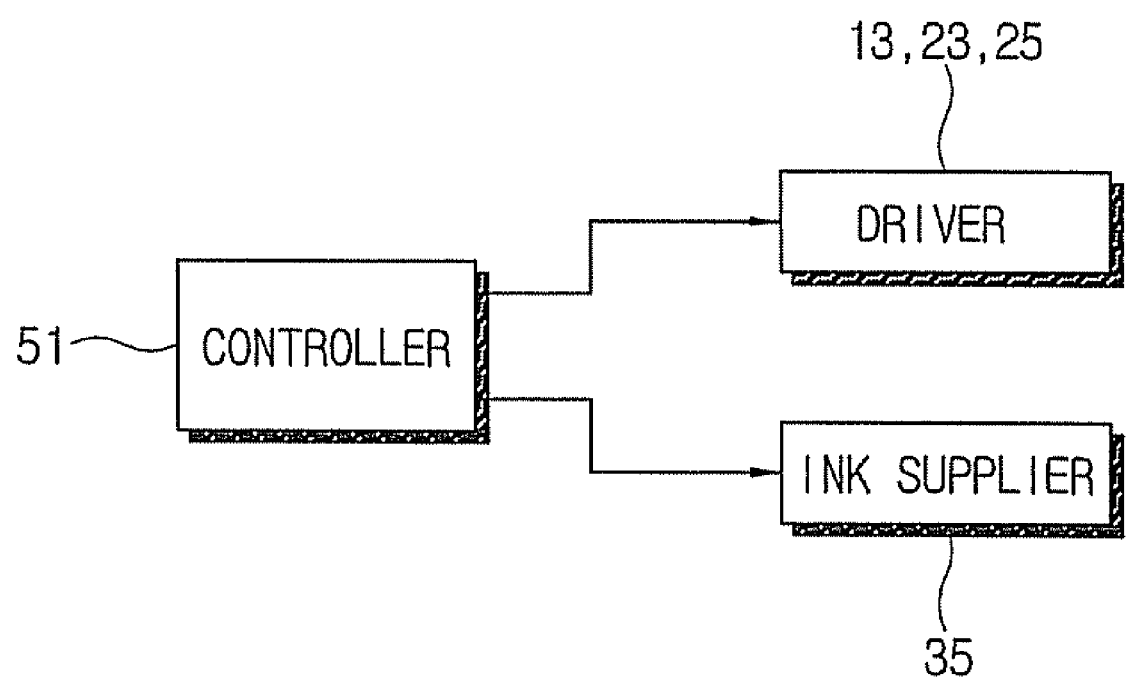
FIG. 3 is a schematic control block diagram of an exemplary embodiment of the inkjet device used in manufacturing the display device according to the present invention.

FIG. 3 is a control block diagram of the inkjet device 1 used in manufacturing the display device according to the present invention. A controller 51 may control the respective drivers 13, 23 and 25 to adjust the distance between the stage 10 and the head main body 31, or may allow the head main body 31 to be positioned above the spittoons 41. The controller 51 may control the ink supplier 35 to jet ink through the nozzles 33 or stop jetting ink. Here, the controller 51 may control the sub-ink suppliers 35a and 35b, independently.

Figure 4:
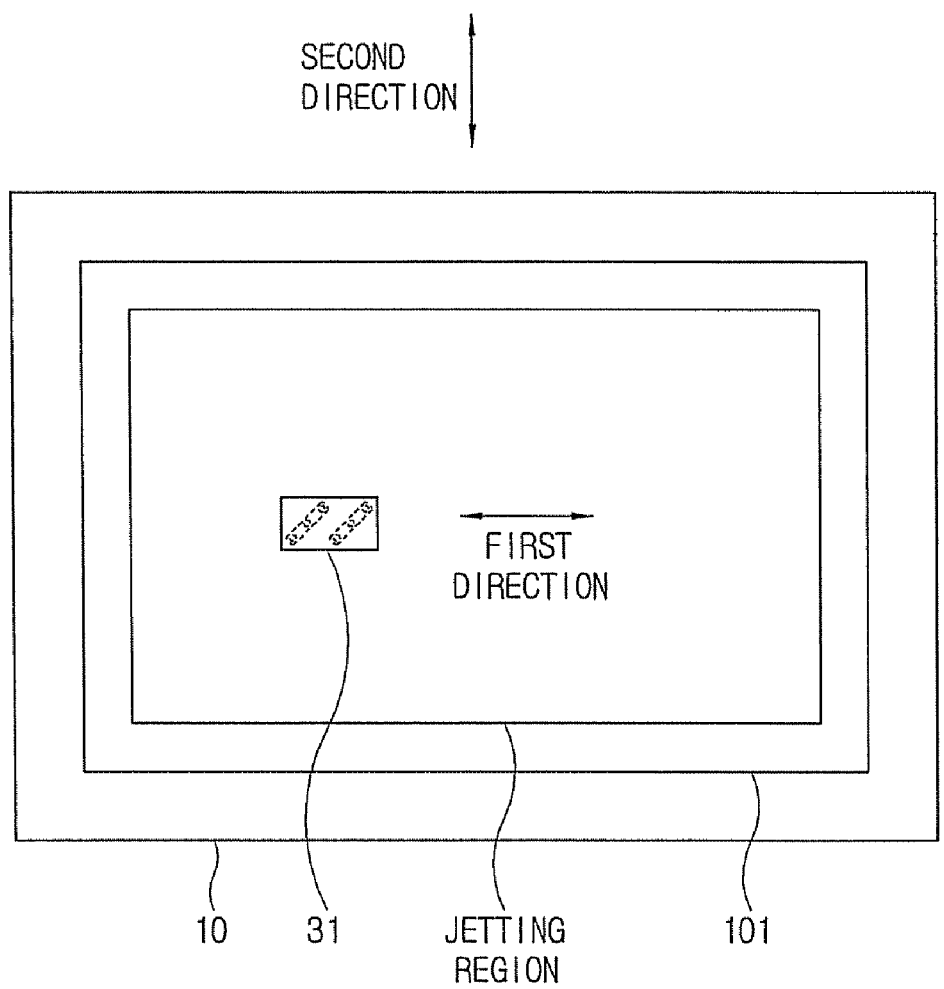
FIG. 4 is a top plan view of an exemplary embodiment of the inkjet device used in manufacturing the display device according to the present invention, on which a substrate is mounted.

FIG. 4 is a top plan view of an exemplary embodiment of the stage 10 and head main body 31 of the inkjet device 1 used to manufacture the display device according to the present invention, when the substrate is mounted on the inkjet device.

A substrate 101 is disposed on a seating region, and comprises a jetting region on which ink is jetted. The jetting region may correspond to a display region.

The foregoing ink device 1 may have various alternative configurations. For example, according to another exemplary embodiment the ink supplier 35 may further comprise an on/off valve provided between the ink tank 36 and the head main body 31. In such an exemplary embodiment, the controller 51 may turn off the valve connected with the nozzle head 32 to stop jetting ink. In another exemplary embodiment the ink supplier may further comprise an ink tank whose pressure is adjustable and the jetting ink through the nozzle 33 can be achieved by adjusting the pressure of the ink tank.

FIG. 4 is a top plan view of the stage 10 and head main body 31 of the exemplary embodiment of an inkjet device 1 used to manufacture the display device according to the present invention, when a substrate is mounted on the inkjet device.

A substrate 101 is disposed on a seating region, and comprises a jetting region on which ink is jetted. The jetting region may correspond to a display region of the display device.

Hereinafter, the display device according to an exemplary embodiment of the present invention will be described with reference to FIGS. 5 and 6.

Figure 5:
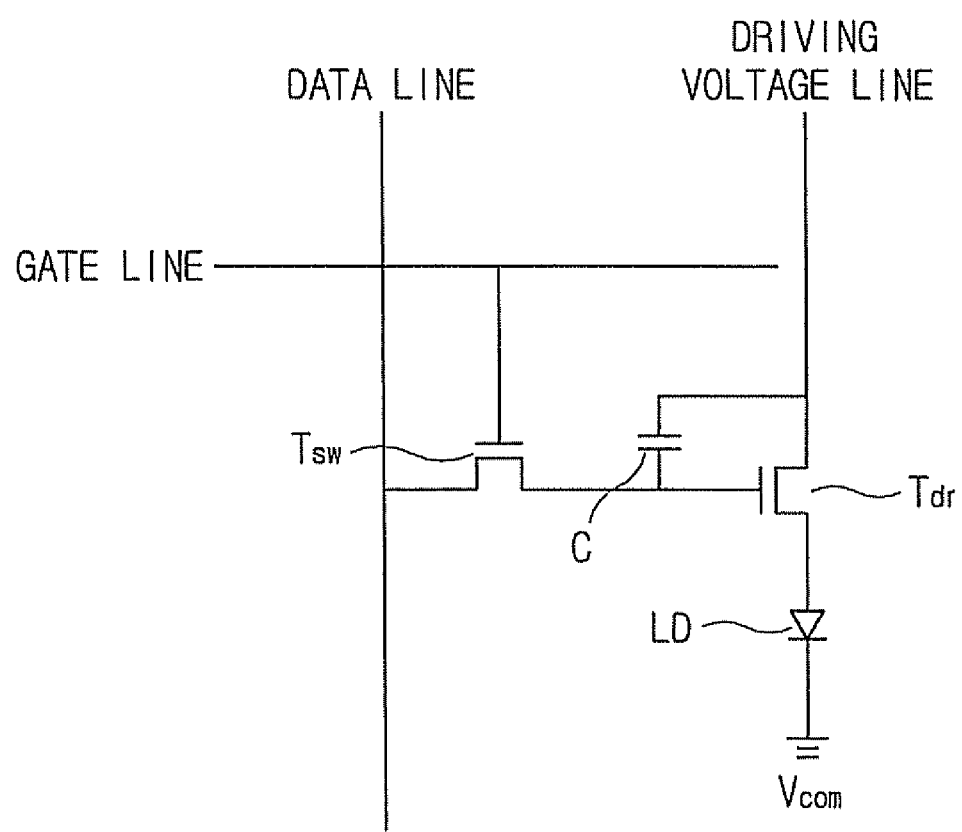
FIG. 5 illustrates an equivalent circuit diagram of an exemplary embodiment of a pixel of the display device according to the present invention.

FIG. 5 is an equivalent circuit diagram of an exemplary embodiment of a pixel in the display device which is manufactured according to the present invention.

A single pixel comprises a plurality of signal lines. The signal lines comprise a gate line which transmits a scanning signal, a data line which transmits a data signal, and a driving voltage line which transmits a driving voltage. The data line and the driving voltage line are provided in parallel with each other. The gate line is perpendicular to the data line and the driving voltage line.

A pixel also comprises an organic light emitting device LD, a switching thin film transistor Tsw, a driving thin film transistor Tdr and a capacitor C.

The driving thin film transistor Tdr comprises a control terminal, an input terminal and an output terminal. The control terminal is connected with the switching thin film transistor Tsw and one end of the capacitor C. The input terminal is connected with the driving voltage line and the other end of the capacitor through the driving voltage line. The output terminal is connected with the organic light emitting device LD.

The organic light emitting device LD comprises an anode which is connected with the output terminal of the driving thin film transistor Tdr; and a cathode which is connected with a common voltage Vcom. The organic light emitting device LD emits lights of different intensity depending on an output current of the driving thin film transistor Tdr. A plurality of light emitting devices may work in conjunction to display an image. The current of the driving thin film transistor Tdr depends on the voltage between the control terminal and the output terminal.

The switching thin film transistor Tsw comprises a control terminal, an input terminal and an output terminal. The control terminal thereof is connected with the gate line, and the input terminal thereof is connected with the data line. The output terminal of the switching thin film transistor Tsw is connected with the control terminal of the driving thin film transistor Tdr and one side of the capacitor C. The switching thin film transistor Tsw transmits the data signal supplied to the data line according to the scanning signal supplied to the gate line, to the driving thin film transistor Tdr.

The capacitor C is connected between the control terminal and the input terminal of the driving thin film transistor Tdr. The capacitor C charges and maintains the data signal input to the control terminal of the driving thin film transistor Tdr.

Figure 6:
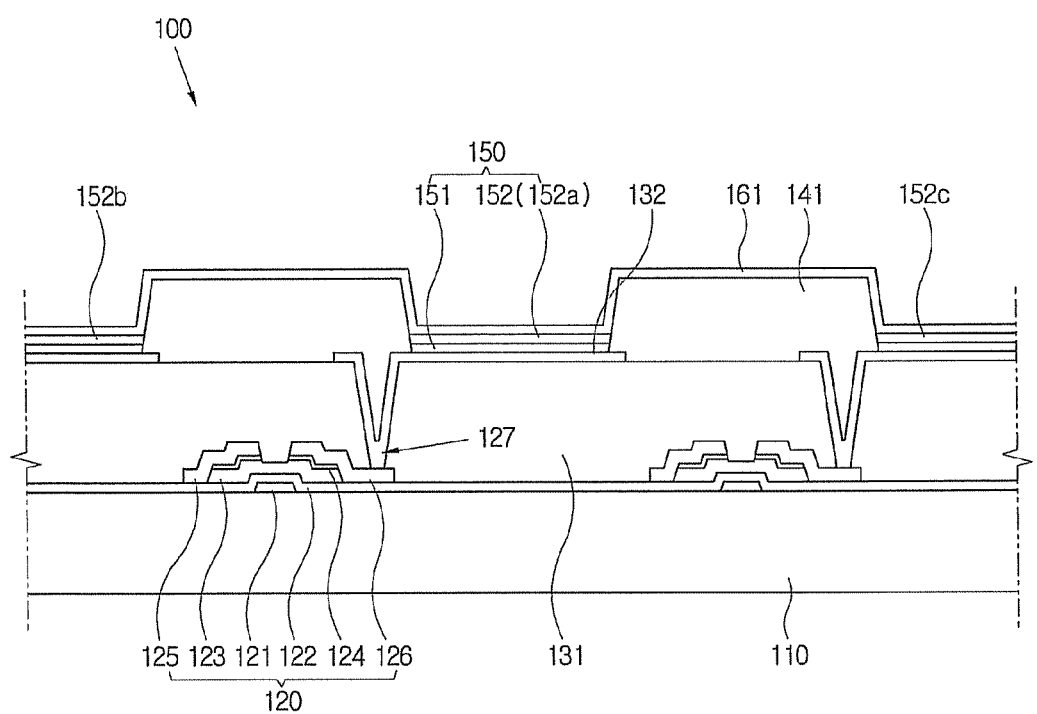
FIG. 6 is a cross-sectional view of an exemplary embodiment of the display device according to the present invention.

FIG. 6 is a cross-sectional view of an exemplary embodiment of the display device which is manufactured according to the present invention.

Hereinafter, the exemplary embodiment of a display apparatus 100 manufactured according to the present invention will be described in detail.

A display device 100 manufactured according to the present invention comprises a thin film transistor 120 which is formed on an insulating substrate 110; a pixel electrode 132 which is electrically connected with the thin film transistor 120; and an organic layer 150 which is formed on the pixel electrode 132.

The thin film transistor 120 according to the current exemplary embodiment comprises amorphous silicon, but the present invention is not limited thereto. Alternative exemplary embodiments include the configuration wherein the thin film transistor 120 may comprise poly silicon.

A gate electrode 121 is formed on the insulating substrate 110 which comprises an insulating material such as glass, quartz, ceramic or plastic.

A gate insulating layer 122 which comprises silicon nitride ("SiNx") is formed on the insulating substrate 110 and the gate electrode 121. A semiconductor layer 123 comprising amorphous silicon and an ohmic contact layer 124 comprising n+ amorphous hydrogenated silicon highly doped with an n-type dopant are sequentially formed on the gate insulating layer 122 corresponding to the gate electrode 121. Here, the ohmic contact layer 124 is separated into two parts with respect to the gate electrode 121.

A source electrode 125 and a drain electrode 126 are formed on the ohmic contact layer 124 and the gate insulating layer 122. Further, the source electrode 125 and the drain electrode 126 are separated with respect to the gate electrode 121.

A passivation layer 131 is formed on the source electrode 125, the drain electrode 126, the exposed sides of the ohmic contact layer 124 and the semiconductor layer 123 exposed between the source and drain electrodes 125 and 126. The passivation layer 131 may comprise silicon nitride ("SiN$_x$") and/or an organic material. A contact hole 127 is formed on the passivation layer 131 to expose the drain electrode 126.

The pixel electrode 132 is formed on the passivation layer 131. The pixel electrode 132, also referred to as an anode, supplies a hole to an organic light emitting layer 152. The pixel electrode 132 comprises a transparent conductive material such as indium tin oxide ("ITO"), indium zinc oxide ("IZO") and may be formed by a sputtering method. The pixel electrode 132 may be patterned as a rectangle as seen from above.

A wall 141 is formed between the pixel electrodes 132. The wall 141 divides the pixel electrodes 132 and defines a pixel region. The wall 141 is formed on the thin film transistor 120 and the contact hole 127. The wall 141 prevents the source electrode 125 and the drain electrode 126 of the thin film transistor 120 from being short-circuited with the common electrode 161 by providing physical separation between them. The wall 141 may comprise a photosensitive material such as acrylic resin, or polyimide resin which has heat resistance and solvent resistance; or an inorganic material such as $SiO_2$, and $TiO_2$. Alternative exemplary embodiments include configurations wherein, the wall 141 comprises a double layer having an organic layer and an inorganic layer.

A hole injecting layer 151 and the organic light emitting layer 152 are formed on the pixel electrode 132.

The hole injecting layer 151 may comprise polythiopene derivative such as poly(3,4-ethylenedioxy thiophene) ("PEDOT") and polystyrene sulfonic acid ("PSS").

The organic light emitting layer 152 comprises a red light emitting layer 152a which emits a red light; a green light emitting layer 152b which emits a green light; and a blue light emitting layer 152c which emits a blue light.

The organic light emitting layer 152 comprises a poly fluorene derivative; a (poly)paraphenylenevinylene derivative; a polyphenylene derivative; polyvinylcarbazole; and poly thiophene. The polymer materials listed above may be doped with a perylene pigment; a rothermine pigment; rubrene; perylene; 9,10-diphenylanthracene; tetraphenylbutadiene; Nile red; coumarine 6; Quinacridone, or other substances with similar characteristics.

The hole transmitted from the pixel electrode 132 is combined with an electron supplied from a common electrode 161 in the organic light emitting layer 152, thereby creating an exciton which emits light during the exciton formation process.

The common electrode 161 is provided on the wall 141 and the organic light emitting layer 152. The common electrode 161, also called a cathode, supplies an electron to the organic light emitting layer 152. The common electrode 161 may be stacked with a calcium layer and an aluminum layer. Preferably, the calcium layer, which has a low work function, is disposed adjacent to the organic light emitting layer 152.

Lithium fluoride increases light emitting efficiency of the organic light emitting layer 152, and thus a lithium fluoride layer may be formed between the organic light emitting layer 152 and the common electrode 161 (not shown).

When the common electrode 161 comprises an opaque material such as aluminum or silver, light emitted from the organic light emitting layer 152 is transmitted to the insulating substrate 110. Such a configuration is called a bottom emission type display.

The display device 100 may further comprise an electron transfer layer (not shown) and an electron injection layer (not shown) which are disposed between the organic light emitting layer 152 and the common electrode 161. The display device 100 may further comprise an encapsulation/absorption member which prevents moisture and air from penetrating to the organic layer 150. The display device 100 may further include another passivation layer to protect the common electrode 161. The encapsulation member may comprise sealing resin and a sealing can.

Hereinafter, an exemplary method of manufacturing the display device 100 according to the present invention will be described with reference to FIGS. 7 to 10.

Figure 7:
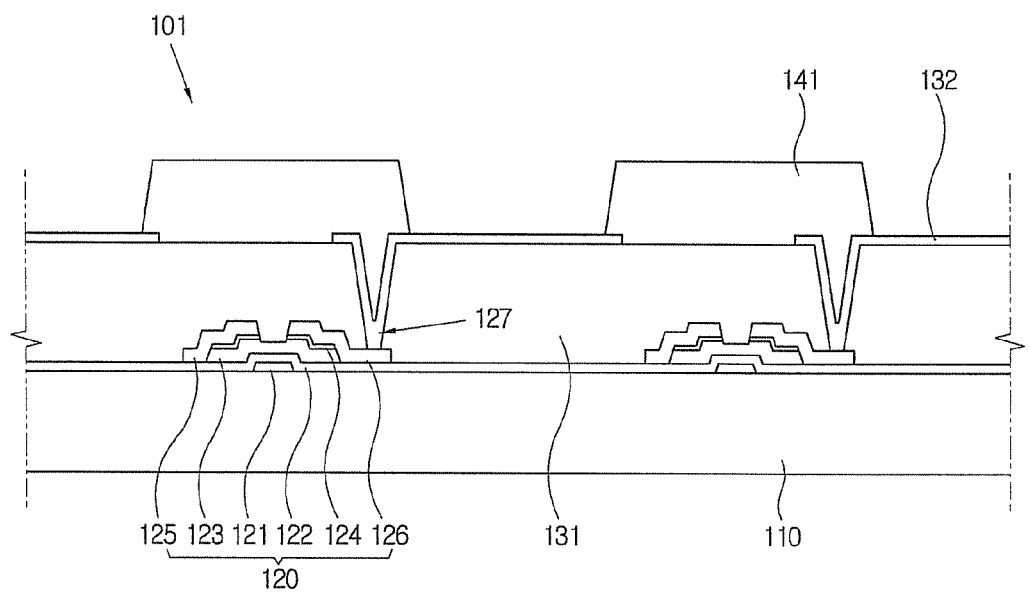
FIG. 7 is a cross-sectional view of an exemplary embodiment of a method of manufacturing the display device according to the present invention.

FIG. 7 is a cross-sectional view of an exemplary embodiment of a method of manufacturing the display device according to the present invention. Referring to FIG. 7, manufacture of the substrate 101 begins by forming the thin film transistor 120, the pixel electrode 132 and the wall 141 are formed on the insulating substrate 110.

A channel of the thin film transistor 120 comprises amorphous silicon, and may be manufactured by well-known methods.

After forming the thin film transistor 120, the passivation layer 131 is formed on the thin film transistor 120. In the exemplary embodiment where the passivation layer 131 comprises silicon nitride, the passivation layer 131 may be formed by a chemical vapor deposition ("CVD") method. In the exemplary embodiment where the passivation layer 131 comprises an organic material, it may be formed by a spin coating or slit coating method. In either case the passivation layer 131 is then patterned to form the contact hole 127 through which the drain electrode 126 is exposed. After forming the contact hole 127, the pixel electrode 132, which is connected with the drain electrode 126 through the contact hole 127, is formed. The pixel electrode 132 may be formed by depositing indium tin oxide ("ITO") through a sputtering method and then patterning it.

The wall 141 may be formed by exposing and developing a photosensitive material layer formed on the pixel electrode 132.

Figure 8A:
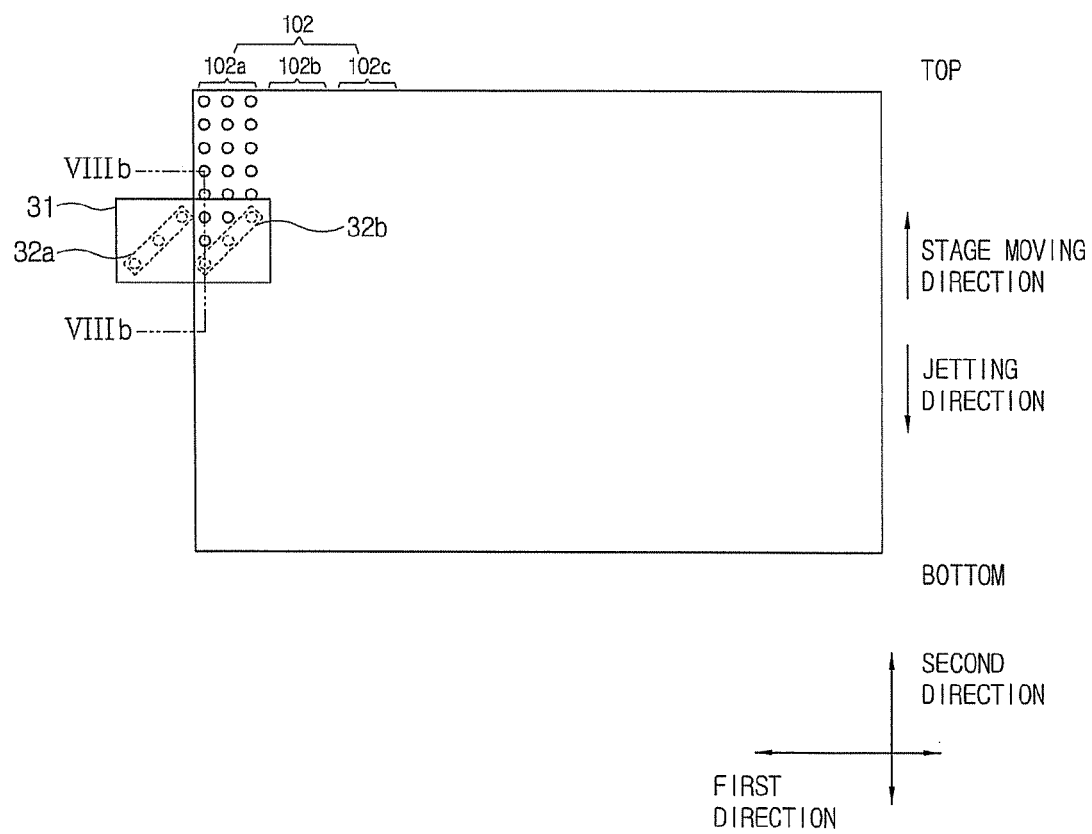
FIG. 8A is a top plan view of an exemplary embodiment of a method of manufacturing the display device according to the present invention.
Figure 8B:
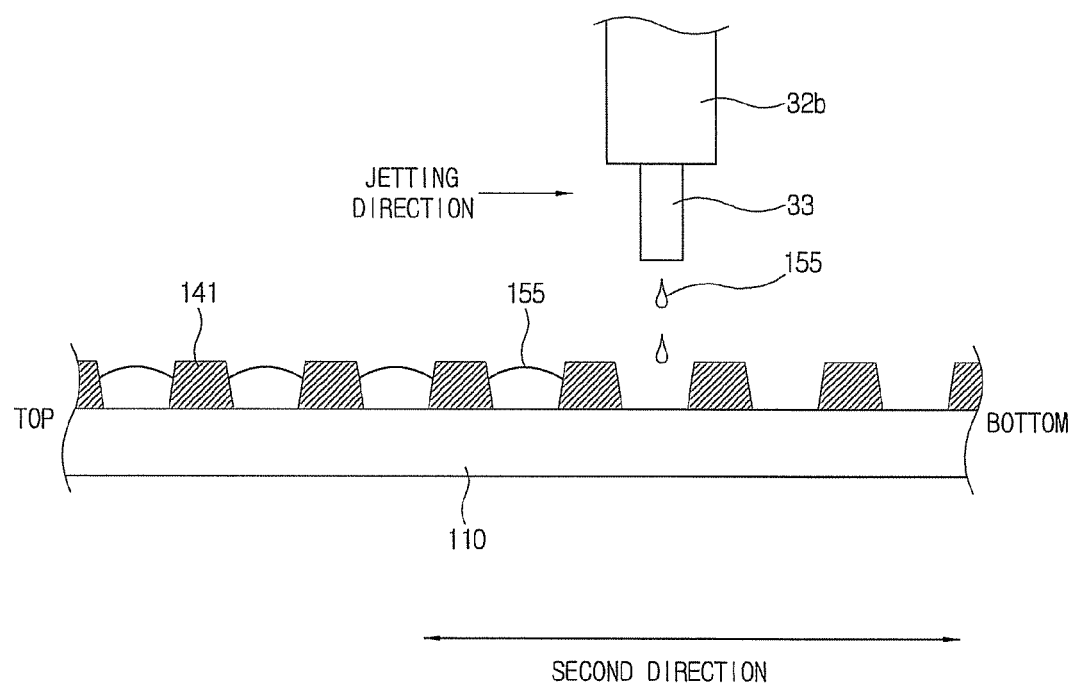
FIG. 8B is a cross-sectional view of an exemplary embodiment of a method of manufacturing the display device according to the present invention taken along line VIIIb-VIIIb in FIG. 8A.

As shown in FIGS. 8A and 8B, a first solvent 155 is jetted to the jetting region. FIG. 8B is a cross-sectional view of the stage 10, taken along line VIIIb-VIIIb in FIG. 8A. The stage 10 moves along the second direction so that the head main body 31, which remains stationary, is passed over the entire length of the jetting region. For reference, the portion of the stage 10 farthest away from the second driver will be called the top and the portion closest to the second driver 13 will be called the bottom. The stage is then moved so that the head main body 31 passes from the top to the bottom of the stage 10.

The sub-nozzle head 32a, which is on a left side of the nozzle head 32 as seen from above, jets a first ink 156a which comprises a hole injecting material. The sub-nozzle head 32b, which is on a right side of the nozzle head 32 as seen from above, jets the first solvent 155. The sub-ink tank 36a stores the first ink 156a comprising the hole injecting material therein. The sub-ink tank 36b stores the first solvent 155 therein.

The jetting region comprises a plurality of sub-jetting regions 102 corresponding to one of the sub-nozzle heads 32a and 32b. The sub-jetting regions 102 extend along a direction of movement of the stage 10.

FIG. 8A illustrates a sub-jetting region 102a which is on a far left side of the plurality of sub-jetting regions 102, to which the first solvent 155 is jetted. Here, the first ink 156a is controlled so as to not jet through the sub-nozzle head 32a; to do so would waste the first ink 156a since it is not over the jetting region. After finishing jetting the first solvent 155 to the sub-jetting region 102a, the head main body 31 moves to slightly to the right to position the sub-nozzle head 32a above the sub-jetting region 102a which was just jetted with the first solvent 155. Now the sub-nozzle head 32a is in position to jet the first ink 156a. This process is described in more detail below.

Figure 9A:
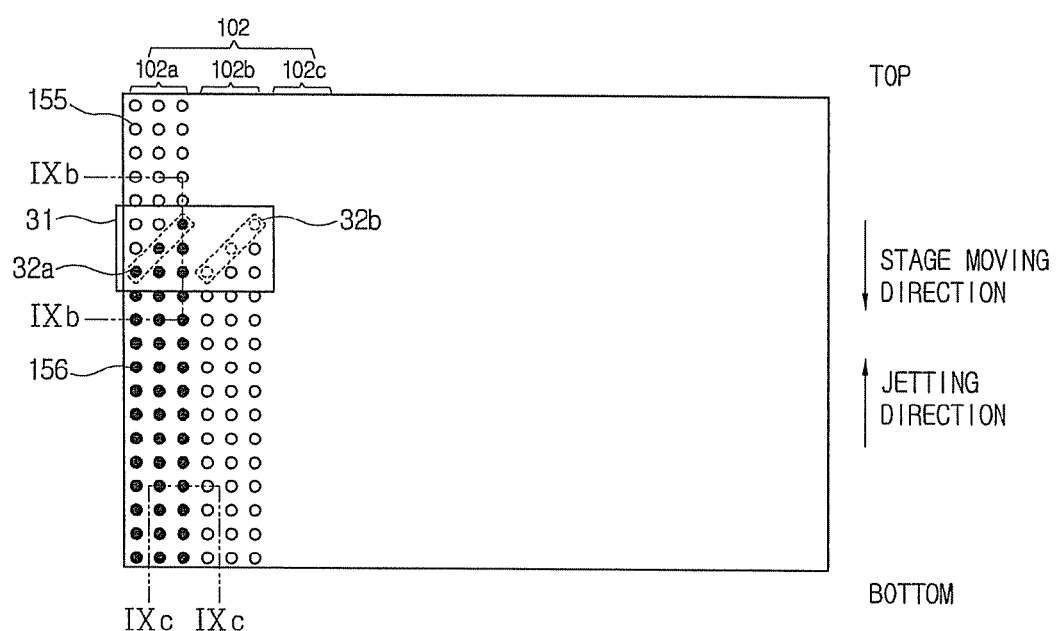
FIG. 9A is a top plan view of an exemplary embodiment of a method of manufacturing the display device according to the present invention.
Figure 9B:
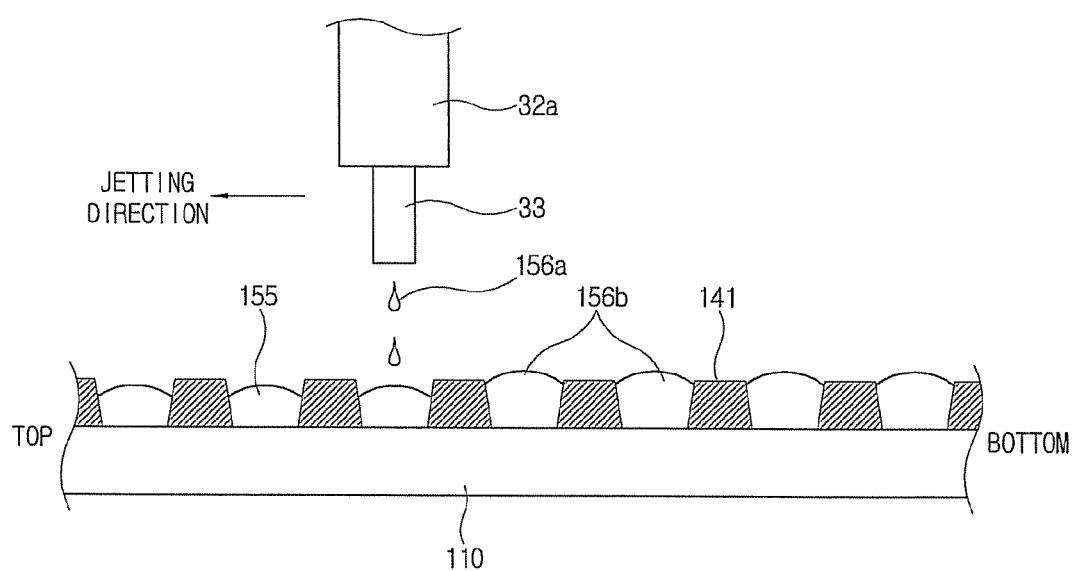
FIG. 9B is a cross-sectional view of an exemplary embodiment of a method of manufacturing the display device according to the present invention taken along line IXb-IXb in FIG. 9A.
Figure 9C:
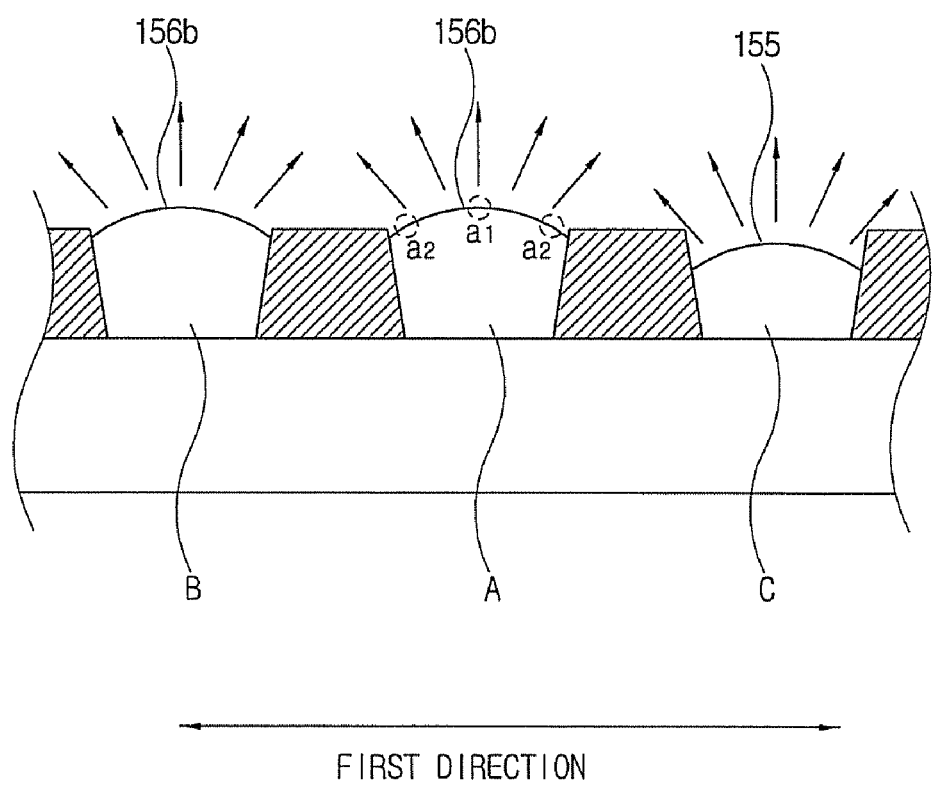
FIG. 9C is a cross-sectional view of an exemplary embodiment of a method of manufacturing the display device according to the present invention taken along line Ixc-IXc in FIG. 9A.

FIGS. 9A to 9C illustrate the sub-jetting region 102a to which the first ink 156a is jetted. FIG. 9B is a cross-sectional view of the substrate 101, taken along line IXb-IXb in FIG. 9A. FIG. 9C is a cross-sectional view of the substrate 101, taken along line IXc-IXc in FIG. 9A.

Referring now to FIGS. 9A to 9C, to ink-jet the first ink 156a the stage 10 changes direction so that the head main body moves from the bottom to the top. Meanwhile, the sub-nozzle head 32b jets the first solvent 155 to a sub-jetting region 102b, immediately to the right of sub-jetting region 102a. The sub-nozzle head 32a jets the first ink 156a to the sub-jetting region 102a which was jetted with the first solvent 155. The jetted first ink 156a and the first solvent 155 are mixed together to form a second ink 156b.

Hereinafter, the first solvent 155 and the first ink 156a will be described in detail.

The first ink 156a comprises a mixture of polythiopene derivative such as poly 3,4-ethylenedioxythiophene ("PEDOT") and polystylenesulfonic acid ("PSS"); and a second solvent in which the foregoing mixture is dissolved. For example, the second solvent may comprise isopropyl alcohol ("IPA"), n-butanol, butylolactone, N-methylpyrolidone, 1,3-dimethyl-2-imidazolinone ("DMI") and a derivative thereof, and glycol ether such as carbitol acetate, butylcarbitolacetate.

The first solvent 155 may vary as follows. In one exemplary embodiment the first solvent 155 may comprise substantially the same material as the second solvent of the first ink 156a.

In another exemplary embodiment the first solvent 155 may comprise a material which has a lower boiling point than the second solvent of the first ink 156a. Then, the volatility of the first solvent 155 is increased so as to make the volatility of the second ink 156b uniform.

In another exemplary embodiment, the second solvent may comprise a first sub-solvent having a lower boiling point and a second sub-solvent having a higher boiling point, the first solvent 155 may comprise the same material as the first sub-solvent. Then, the volatility of the first solvent 155 is increased to make the volatility of the second ink 156b uniform. According to one exemplary embodiment, the boiling point difference between the first and second sub-solvents is 50° C. or more. According to yet another exemplary embodiment, the boiling point difference therebetween may be 50° C. to 100° C.

The first solvent 155 will be described in detail with reference to FIG. 9C. The second ink 156b is disposed on a portion A and a portion B. The first solvent 155 is disposed on a portion C which is on a right side of the portion A.

Unlike the current exemplary embodiment, when the first solvent 155 is not provided on the portion C the drying condition of the second ink 156b on the portion A is as follows. The portion A is disposed on a boundary of the sub-jetting region 102a and the neighboring sub-jetting region 102b.

The second ink 156b on the portion A has a thicker center part and a thinner circumference due to surface tension. The vapor density of the second ink 156b is higher in a center a1 than in a circumference a2. The drying speed of the solvent is inverse-proportional to the vapor density surrounding the second ink 156b, and as a result the solvent is more actively dried in the circumference a2 than in the center a1. The hole injecting material of the second ink 156b moves to the circumference a2 where the solvent is actively dried. Thus, the hole injecting layer 151 has a higher circumference a2 than the center a1. The hole injecting layer 151 that results from this process has a decreased brightness and aperture ratio, in addition to a decreased life span.

Whenever ink is sequentially jetted to the sub-jetting regions 102a, 102b and 102c, the drying conditions therebetween will vary. Accordingly, the shape of the hole injecting layer 151 varies depending on its location in the sub-jetting regions 102a, 102b and 102c.

In the present invention, as shown in FIG. 9C, the drying of the second ink 156b on the portion A is influenced by the neighboring second ink 156b and first solvent 155. As vapor of the first solvent 155 is supplied to the region around A, the center a1 and the circumference a2 of the region around A have almost the same vapor density. Then, due to the near uniformity of the vapor density supplied by the first solvent, the second ink 156b on the portion A is uniformly dried regardless of position, thereby forming the hole injecting layer 151 having a uniform thickness.

The pixel filling characteristic of the second ink 156b improves due to the jetted first solvent 155.

The second ink 156b on the portion B, which is in the middle column of the sub-jetting region 102a, and the second ink 156b on the portion A, which is in a column on the circumference of the sub-jetting region 102a, are dried under similar conditions, due to the first solvent 155 on the sub-jetting region 102b. Thus, the shape of the hole injecting layer 151 is uniform over the entire sub-jetting region 102.

Figure 10:
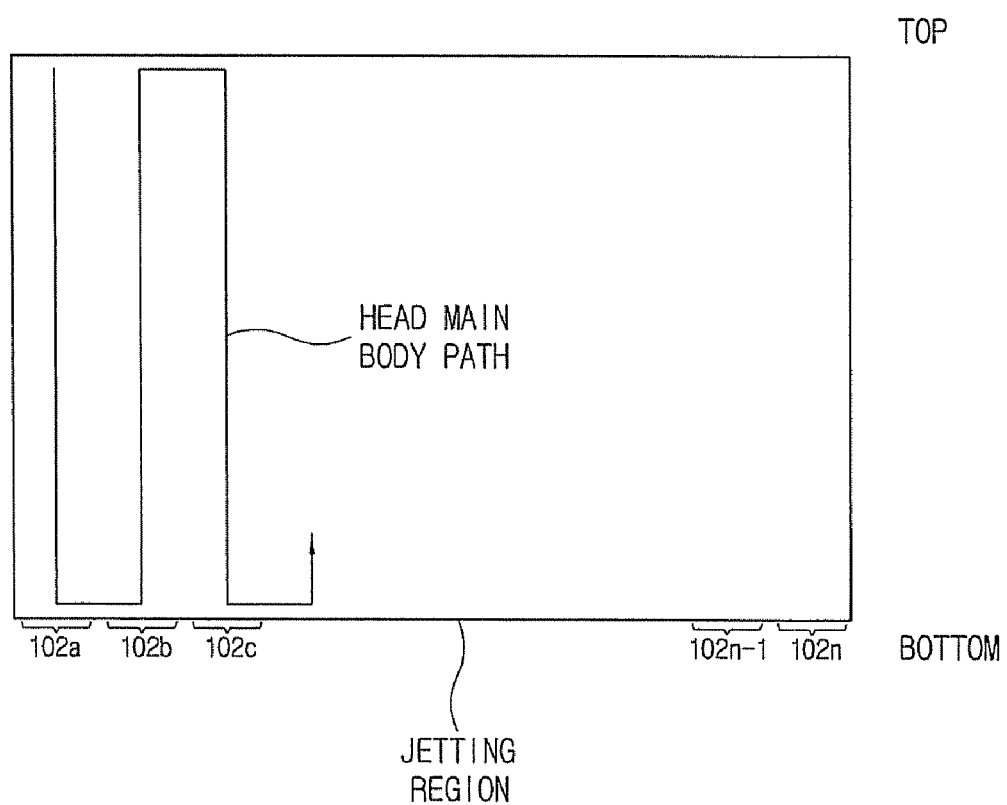
FIG. 10 is a top plan view of an exemplary embodiment of a method of manufacturing the display device according to the present invention illustrating an exemplary path that a head main body takes over a jetting region of a substrate.

As shown in FIG. 10, the stage 10 and the head main body 31 move so that a zigzag pattern is formed to jet the first solvent 155 and the first ink 156a, thereby forming the second ink 156b throughout the sub-jetting region 102. As the first solvent 155 is jetted prior to the first ink 156a, the first solvent 155 is always disposed around the second ink 156b to allow the solvent of the second ink 156b to dry uniformly.

The hole injecting layer 151 is formed by drying the second ink 156b. The organic light emitting layer 152 is formed through a similar method to that of the hole injecting layer 151.

The common electrode 161 is formed on the wall 141 and the organic light emitting layer 152 to complete the display device 100 as shown in FIG. 6.

Figure 11:
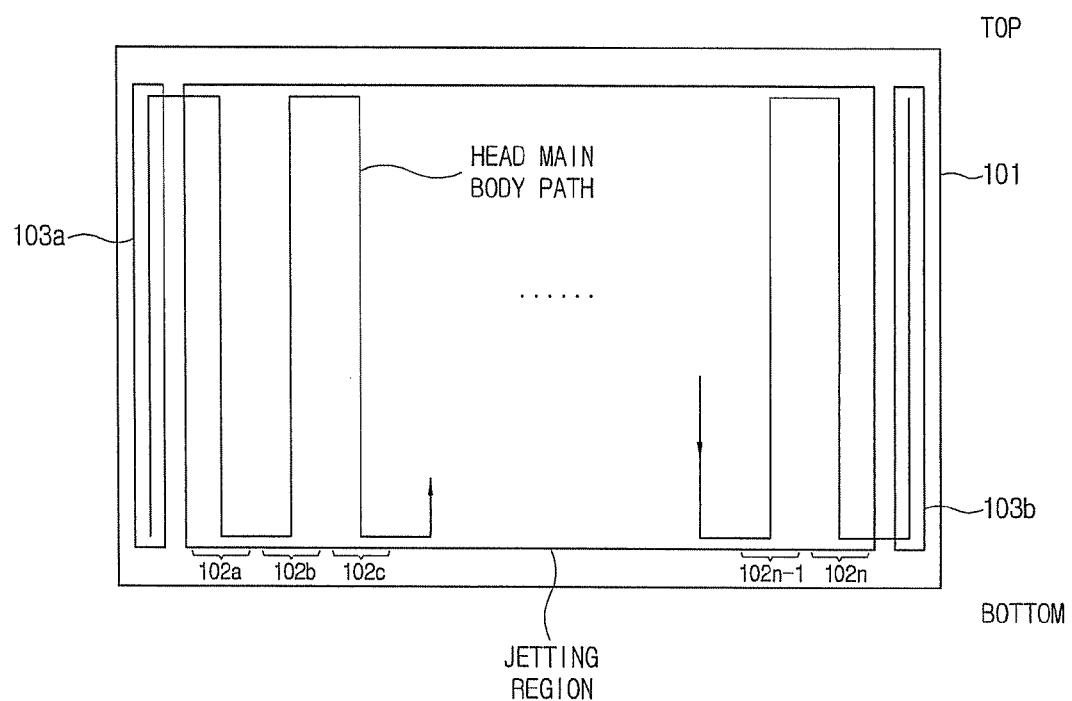
FIG. 11 is a top plan view of an exemplary embodiment of a method of manufacturing the display device according to the present invention illustrating another exemplary path that a head main body takes over a jetting region of a substrate.

FIG. 11 illustrates another exemplary embodiment of a manufacturing method of a display device according to the embodiment of the present invention.

A first solvent 155 and a first ink 156a are jetted to a jetting region using the same method as described in the foregoing exemplary embodiment, except that solvent jetting regions 103a and 103b are provided on opposite ends of the jetting region on the substrate 101. The first solvent 155 is jetted to the solvent jetting region 103a which is disposed on the left side of the substrate 101, before the jetting region is jetted. The first solvent 155 is jetted to the solvent jetting region 103b which is disposed on the right side, after the jetting region is jetted.

In the previous exemplary embodiment, the first solvent is only disposed on the right side of the sub-jetting region 102a and the second ink 156b is only disposed on the left side of the sub-jetting region 102n while the first ink 156a is jetted. This means that the columns which are the closest to the edges of the stage 10 along the first direction do not have an adjacent column to contribute additional vapor for a uniform evaporation. Thus, the drying condition of the sub-jetting regions 102a and 102n are slightly different from that of the other sub-jetting regions 102.

In the present exemplary embodiment, the first solvent 155 jetted to the solvent jetting regions 103a and 103b allows the drying conditions of the sub-jetting regions 102a and 102n to be similar to that of other sub-jetting regions 102. Thus, the quality of the hole injecting layer 151 is uniform and the shape of the hole injecting layer 151 has less variation between the sub-jetting regions 102.

Figure 12A:
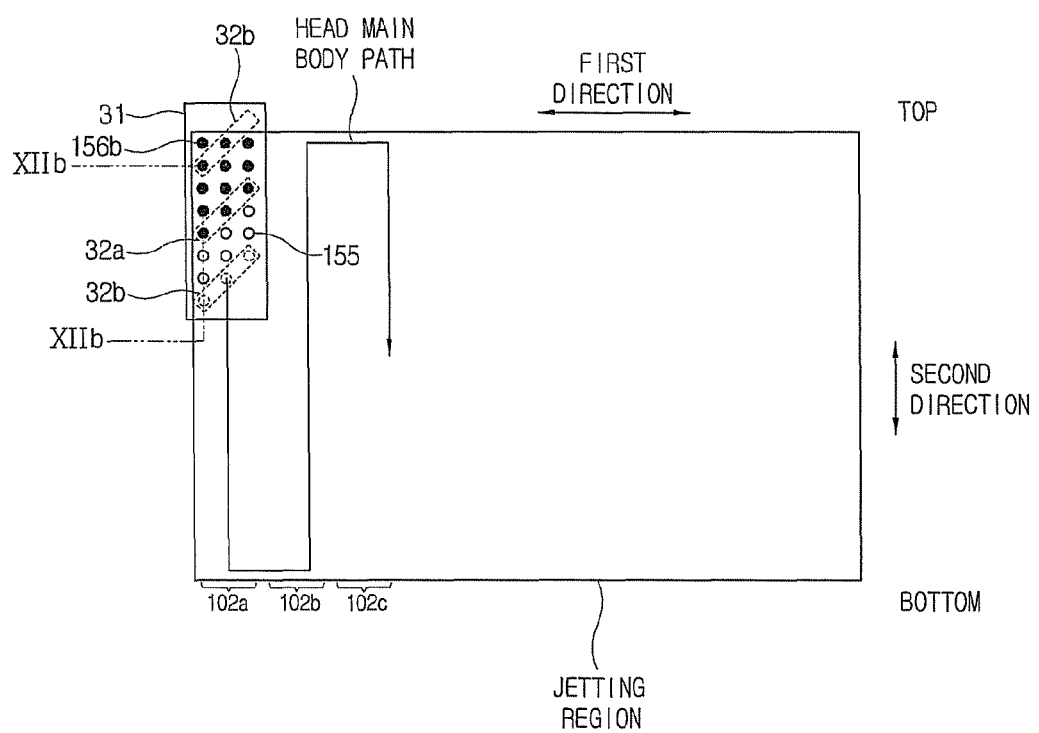
FIG. 12A is a top plan view of an exemplary embodiment of a method of manufacturing the display device according to the present invention illustrating another exemplary path that a head main body takes over a jetting region of a substrate
Figure 12B:
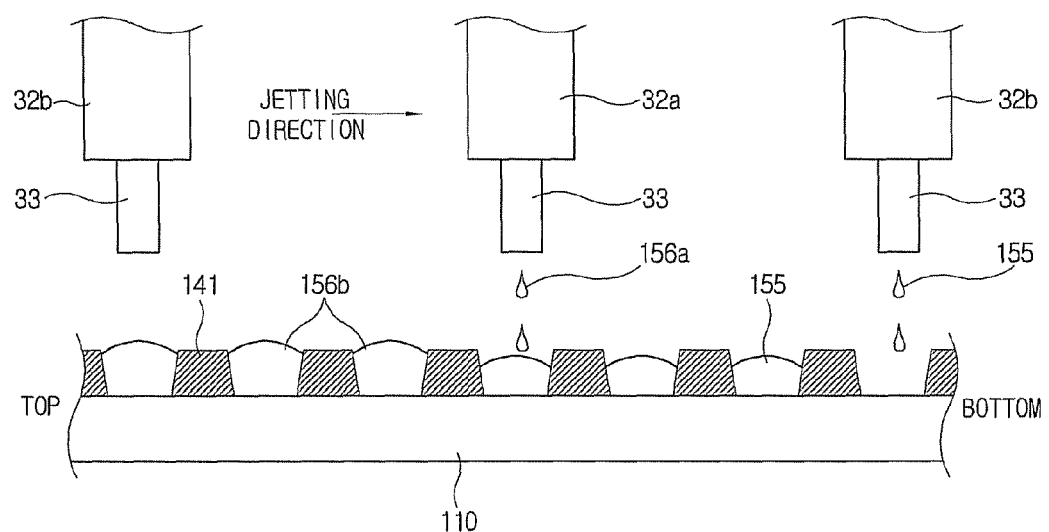
FIG. 12B is a cross-sectional view of an exemplary embodiment of a method of manufacturing the display device according to the present invention taken along line XIIb-XIIb of FIG. 12A.

FIGS. 12A and 12B illustrate another exemplary embodiment of a manufacturing method of a display device according to the present invention. FIG. 12B is a sectional view of the substrate 101, taken along line XIIb-XIIb in FIG. 12A.

According to this exemplary embodiment of the present invention, there are provided three nozzle heads 32 which are disposed along the second direction, e.g., the direction of movement of the stage 10. The nozzle heads 32 comprise, from top to bottom, a sub-nozzle head 32b which supplies a first solvent 155, a sub-nozzle head 32a which supplies a first ink 156a; and another sub-nozzle head 32b which supplies a first solvent 155. This configuration leaves the sub-nozzle head 32a between the two sub-nozzle heads 32b.

The nozzle heads 32 are disposed to correspond to one sub-jetting region 102. The first solvent 155 is supplied first, and then the first ink 156a is supplied to the sub-jetting region 102. Only one of the pair of the sub-nozzle heads 32b supplies the first solvent 155 along the direction of movement of the head main body 31. Thus, the sub-nozzle head 32b which is closer to the bottom of the jetting region jets as the jetting direction moves toward the bottom and the sub-nozzle head closer to the top jets as the jetting direction moves toward the top. This method ensures that there is always at least one sub-jetting region jetted with the first solvent 155 adjoining a sub-jetting region drying the second ink 156b.

As described above, the present invention provides a manufacturing method of a display device which has an uniform organic layer.

Also, the present invention provides a display device which has a uniform organic layer, and a manufacturing device therefor.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A method of manufacturing a display device, comprising:
   forming a thin film transistor on an insulating substrate;
   forming an electrode which is electrically connected with the thin film transistor;
   forming a wall which surrounds the electrode;
   supplying a first solvent to the electrode which is surrounded by the wall; and
   supplying ink which comprises an organic material and a second solvent to the electrode which has received the first solvent,
   wherein the first solvent has a lower boiling point than the second solvent.

2. The method according to claim 1, wherein the first solvent is supplied to at least one of a plurality of electrodes around the circumference of the electrode which receives the ink.

3. The method according to claim 1, wherein the second solvent comprises a first sub-solvent which has a first boiling point and a second sub-solvent which has a second boiling point higher than the first boiling point, and
   the first solvent and the first sub-solvent comprise substantially the same material.

4. The method according to claim 1, wherein the ink is supplied along a plurality of sub-jetting regions which are provided in parallel with each other in a first direction and elongated in a second direction which is substantially perpendicular to the first direction.

5. The method according to claim 4, wherein the first solvent is supplied along a sub-jetting region which is adjacent to the sub-jetting region wherein the ink is supplied.

6. The method according to claim 4, wherein the ink is sequentially supplied in the first direction with respect to the plurality of sub jetting regions, and the sub-jetting region along which the first solvent is supplied is ahead of the sub-jetting region along which the ink is supplied, along the first direction.

7. The method according to claim 4, wherein the first solvent and the ink are supplied along the same sub-jetting region.

8. The method according to claim 4, wherein the plurality of sub-jetting regions comprise a pair of external sub-jetting regions disposed opposite each other along the first direction, and an internal sub-jetting region which is disposed within the pair of external sub-jetting regions, and a greater amount of the first solvent is supplied to the pair of external sub-jetting regions than to the internal sub-jetting regions.

9. The method according to claim 4, wherein the plurality of sub-jetting regions comprise a pair of external sub-jetting regions disposed opposite each other along the first direction, and an internal sub-jetting region which is disposed within the pair of external sub-jetting regions, further comprising:

supplying the first solvent to the pair of external sub-jetting regions.

* * * * *